United States Patent

Ichinose et al.

[11] Patent Number: 5,859,397
[45] Date of Patent: Jan. 12, 1999

[54] PROCESS FOR THE PRODUCTION OF A PHOTOVOLTAIC ELEMENT

[75] Inventors: Hirofumi Ichinose, Tokyo; Akio Hasebe, Nagahama; Tsutomu Murakami, Nara; Satoshi Shinkura, Nagahama; Yukie Ueno, Nara, all of Japan

[73] Assignee: Canon Kabushiki Kaisha, Tokyo, Japan

[21] Appl. No.: 857,905

[22] Filed: May 16, 1997

[30] Foreign Application Priority Data

May 17, 1996 [JP] Japan ................................. 8-146542

[51] Int. Cl.$^6$ .............................. C07C 1/00; C30B 30/02; C23F 13/00; C25F 1/00
[52] U.S. Cl. ................. 204/157.15; 205/687; 205/724; 205/766; 205/769
[58] Field of Search ....................... 204/157.15; 205/687, 205/724, 766, 769; 428/4, 12

[56] References Cited

U.S. PATENT DOCUMENTS

| | | | |
|---|---|---|---|
| 4,729,790 | 3/1988 | Nath et al. | 437/225 |
| 4,729,970 | 3/1988 | Nath et al. | 437/4 |
| 5,084,400 | 1/1992 | Nath et al. | 437/4 |
| 5,320,723 | 6/1994 | Kawakami | 204/140 |

*Primary Examiner*—Arun S. Phasge
*Assistant Examiner*—Edna Wong
*Attorney, Agent, or Firm*—Fitzpatrick, Cella, Harper & Scinto

[57] ABSTRACT

A process for producing a photovoltaic element, said process comprising the steps of: providing a photovoltaic element comprising a lower electrode layer comprising a metallic layer comprising aluminum or an aluminum compound and a transparent and electrically conductive layer, a photoelectric conversion semiconductor layer, and a transparent electrode layer stacked in the named order on an electrically conductive surface of a substrate, and immersing said photovoltaic element in an electrolyte solution to passivate an short-circuited current path defect present in said photovoltaic element by the action of an electric field, wherein said electrolyte solution has a chlorine ion content of 0.03 mol/l or less.

12 Claims, 3 Drawing Sheets

PROCESS FOR THE PRODUCTION OF A PHOTOVOLTAIC ELEMENT

BACKGROUND OF THE INVENTION

1. Field of the Invention

The present invention relates to a process for producing a highly reliable photovoltaic element. More particularly, the present invention relates to a process for producing a highly reliable photovoltaic element excelling in characteristics by subjecting a photovoltaic element having a short-circuited current path defect therein to electrolytical treatment using a specific electrolyte solution to passivate said short-circuited current path defect present in said photovoltaic element.

2. Related Background Art

In recent years, various studies have been made in order to develop a large area photovoltaic element usable, for instance, as a solar cell for power generation. Particularly, various studies have been made in order to develop a large area photovoltaic element having a multi-layered structure comprising a semiconductor material composed of an amorphous material such as an amorphous silicon (a-Si) material. In order to produce such a large area photovoltaic element, public attention has been focused on a continuous film-forming process such as a so-called roll-to-roll film forming process.

However, it is difficult to efficiently and stably produce a large area photovoltaic element having a multi-layered structure which is free of defects such as short circuit defects in the entire region thereof. For instance, in the case of a large area thin film photovoltaic element having a stacked semiconductor structure comprising a plurality of thin semiconductor films formed of an amorphous material such as an a-Si being stacked, it is known that upon forming the stacked semiconductor structure, defects such as pinholes are liable to occur due to contamination of a foreign matter such as dust or the like in the film formed, and these defects entail shunts or short circuit defects which result in making the photovoltaic element to be markedly inferior in the characteristics required for a photovoltaic element, particularly, in the voltage-generating characteristic (in terms of the voltage component).

Herein, description will be made of the reason why such defect is occurred. For instance, in the case of an amorphous silicon photovoltaic element (or an amorphous silicon solar cell) formed on a surface of a metal substrate such as a stainless steel substrate, the substrate surface is not an entirely smooth surface but is usually provided with irregularities based on a flaw, recess, or spike-like shaped protrusion, and an electrode layer (or a back reflecting layer) having an uneven surface provided with irregularities for scattering light is often formed on the substrate surface. And on such uneven substrate surface or such uneven surface of the electrode layer, a p-type or n-type semiconductor layer comprising a thin semiconductor film having a thickness of several hundreds angstroms is formed, where it is difficult to completely cover the irregularities present at the surface of the substrate or the surface of the electrode layer and because of this, defects such as pinholes are liable to occur in the amorphous silicon photovoltaic element. In this case, pinholes are liable to occur also due to fine dusts in the film formation process.

In the case of an amorphous silicon photovoltaic element (or an amorphous silicon solar cell) comprising a lower electrode layer, a photoelectric conversion semiconductor layer comprising a plurality of amorphous silicon thin films being stacked and having such pinholes as above described, and a transparent upper electrode layer stacked in the named order on a substrate having a surface provided with a defect based on such spike-like shaped protrusion as above described, the photovoltaic element is problematic in that the photoelectric conversion semiconductor layer is defected due to the pinholes to directly contact the lower electrode layer with the transparent upper electrode layer or to contact the defect of the substrate surface. There is also a problem in that the photoelectric conversion semiconductor layer is not entirely defected but is in a state with a shunted or short-circuited portion having a low electric resistance. In this case, an electric current generated by the photoelectric conversion semiconductor layer upon the irradiation of light thereto sometimes flows in parallel to the transparent upper electrode layer to flow into a low electrically resistant portion of the shunted or short-circuited portion, where a loss in the electric current is occurred. When such loss in the electric current should be occurred, the open circuit voltage, namely, the voltage-generating characteristic, of the photovoltaic element (the solar cell) is markedly decreased. This phenomenon is more significant under condition of a low illumination intensity. This situation is seriously problematic for a solar cell for which effective power generation is required under all weather environmental condition.

For the photovoltaic element (or the solar cell) having such short-circuited portion as above described into which an electric current is flown to cause the foregoing loss in the electric current, there is a demand for diminishing the loss in the electric current as such as possible. In order to comply with this demand, there has been proposed a manner of -diminishing the loss in the electric current by directly eliminating the foregoing defects such as pinholes or eliminating or electrically insulating the peripheral material of the short-circuited portion.

Particularly, U.S. Pat. No. 4,729,970 (hereinafter referred to as document 1) discloses a manner of contacting a conversion reagent with a short circuit defect portion present in a photovoltaic device having a transparent and electrically conductive film to make a portion of the transparent and electrically conductive film in the vicinity of the short circuit defect portion to have a high electrical resistance, whereby electrically isolating the short circuit defect portion from the electrode of the photovoltaic device.

U.S. Pat. No. 5,084,400 (hereinafter referred to as document 2) discloses a manner of immersing a photovoltaic device with an electrically conductive film which is formed on a metal substrate and has a short circuit defect portion therein in a solution of an inorganic acid such as $H_2SO_4$ or the like while impressing an electric voltage thereto to make a portion of the electrically conductive film in the vicinity of the short circuit defect portion to have a high electrical resistance, whereby electrically isolating the short circuit defect portion from the electrode of the photovoltaic device.

U.S. Pat. No. 5,320,723 (hereinafter referred to as document 3) discloses a manner of removing a short circuit defect portion present in a photoelectric conversion device by way of electrolytical treatment using an electrolyte solution containing an inorganic or organic acid, an inorganic or organic base, or a metal salt.

Besides these, it is known that in order to improve the utilization efficiency of light in a photovoltaic element comprising a photoelectric conversion semiconductor layer formed on a substrate, light arrived at the substrate through the photoelectric conversion semiconductor layer is reflected by means of a metal layer as a back reflecting layer formed between the substrate and the photoelectric conversion semiconductor layer to return it into the photoelectric conversion semiconductor layer.

It is known that the metal layer is constituted by a metallic material having a high reflectance such as Ag. However, for Ag used in this case, it is known that Ag is readily reacted with moisture to cause an Ag dendritic crystal growth which results in entailing a shunt in the photovoltaic element. In this respect, the metal layer as the back reflecting layer is usually constituted by an aluminum material.

It is also known that in order to prolong the optical path length for light in the photoelectric conversion semiconductor layer by way of light reflection, a transparent and electrically conductive layer comprising ZnO or the like and having an uneven surface is disposed between the back reflecting layer and the photoelectric conversion semiconductor layer.

However, in the case of removing a defect such as short circuit defect portion present in a photovoltaic element comprising a multi-layered photoelectric conversion semiconductor layer and having the back reflecting layer composed of the aluminum material and/or the transparent and electrically conductive layer by any of the above described defect-removing manners, such problems as will be described are liable to occur.

In the case of the manner described in document 1, when a conversion reagent containing a salt of a Lewis acid and an amphoteric element, particularly, a solution containing a chloride salt such as $AlCl_3$, $ZnCl_2$ or the like is used, an amphoteric metal such as Al is liable to significantly corrode into the back reflecting Al layer, resulting in entailing a problem such that side effects such as layer peeling, for example, at the interface between the Al layer and the ZnO layer is occurred.

In the case of the manner described in document 2, there is a problem in that when the electrolyte solution is used for a long period of time, the acid component thereof is concentrated so that to control so as to conduct stable reaction is difficult. There is also a problem in that when the acid concentration of the electrolyte solution is controlled so as to effectively work in removing a short circuit defect portion present in a photovoltaic element having a multi-layered lower electrode layer comprising, for instance, a metal layer and a transparent and electrically conductive layer comprising ZnO or the like, the transparent and electrically conductive layer is liable to corrode.

Similarly in the case of the manner described in document 3, there is a problem in that when the electrolyte solution contains chlorine ion, side effects such as layer peeling, for example, at the interface between the Al layer and the ZnO layer is liable to occur.

SUMMARY OF THE INVENTION

An object of the present invention is to eliminate the foregoing problems in the prior art and to provide an improved process which enables to markedly diminish the occurrence of a leakage current due to defects such as pinholes present in a large area photovoltaic element whereby converting said photovoltaic element into a highly reliable photovoltaic element in which the voltage-generating characteristic at a low illumination intensity is desirably recovered.

Another object of the present invention is to provide a process for efficiently producing a highly reliable photovoltaic element having a productivity.

A further object of the present invention is to provide a process for producing a highly reliable photovoltaic element excelling in the characteristics required for a photovoltaic element by subjecting a photovoltaic element having a short-circuited current path defect therein to electrolytical treatment using a specific electrolyte solution to passivate said short-circuited current path defect present in said photovoltaic element.

DESCRIPTION OF THE INVENTION AND PREFERRED EMBODIMENTS

The present invention will be detailed with reference to embodiments which will be described below. It should be understood that the present invention is restricted by these embodiments.

As previously described, the present invention provides an improved process for efficiently producing a highly reliable photovoltaic element having a productivity.

A typical embodiment of the process for the production of a highly reliable photovoltaic element comprises the steps of:

providing a photovoltaic element comprising (a) a two-layered lower electrode layer comprising (a-i) a metallic layer composed of aluminum or an aluminum compound and (a-ii) a transparent and electrically conductive layer, (b) a photoelectric conversion semiconductor layer, and (c) a transparent electrode layer stacked in the named order on an electrically conductive substrate, and immersing said photovoltaic element in an electrolyte solution to passivating (or electrically isolating) a short-circuited current path defect present in said photovoltaic element by the action of an electric field, wherein said electrolyte solution has a chlorine ion content of 0.03 mol/l or less.

The electrolyte solution used in the present invention may further contain a protective ion capable of preventing occurrence of layer peeling at the interface between the metallic layer (a-i) with the substrate or/and at the interface between the metallic layer (a-i) and the transparent and electrically conductive layer (a-ii). The protective ion is an ion based on a compound selected from the group consisting of sulfate, nitrate, chromate, acetate, benzoate, and oxalate.

The electric field used in the present invention may be either an electric field generated by impressing a bias power to the photovoltaic element or an electric field generated by an electromotive force of the photovoltaic element which is generated by irradiating light to the photovoltaic element.

The present invention has been accomplished based on the following findings obtained through experimental studies by the present inventors in order to attain the objects of the present invention.

In order to passivate a short-circuited current path defect present in a photovoltaic element comprising a lower electrode layer, a photoelectric conversion semiconductor layer having a multi-layered structure and a transparent electrode layer stacked in the named order on an electrically conductive substrate by way of electrolytical treatment, the present inventors conducted a manner of immersing said photovoltaic element in a specific electrolyte solution having a chlorine ion content of 0.03 mol/l or less while supplying an electric field to the photovoltaic element and while preventing the lower electrode layer from peeling, whereby reducing the transparent electrode layer. As a result, there were obtained the following facts.

Even in the case where the lower electrode layer is composed of an amphoteric metallic material such as aluminum (Al) or an aluminum compound and a transparent and electrically conductive layer is interposed between the lower electrode layer and the photoelectric conversion semiconductor layer, a portion of the transparent electrode layer in the vicinity of a defect or pinhole in the photoelectric conversion semiconductor layer is reduced into a localized portion having an increased electric resistance without entailing layer peeling for the backing and without causing leakage current, where the starting photovoltaic element is converted into a highly reliable photovoltaic element which is satisfactory in the characteristics required for a photovoltaic element, particularly, in the voltage-generating characteristic at a low illumination.

The present inventors obtained further findings as will be described in the following. As the electrolyte solution, when an adequate electrolyte solution comprising a selected electrolyte and having a chlorine content of 0.03 mol/l or less and which is capable of supplying a protective ion is used depending upon the kind of the constituent of the lower electrode layer, the reduction of the transparent electrode layer positioned on the photoelectric conversion semiconductor layer can be desirably accomplished while preventing layer peeling for the backing and without the photovoltaic element being deteriorated for its exterior appearance and characteristics, whereby a highly reliable photovoltaic element excelling in voltage-generating characteristic can be effectively obtained.

In the present invention, in the case of passivating a short-circuited current path defect present in a multi-layered thin film photovoltaic element comprising a lower electrode layer, a photoelectric conversion semiconductor layer and a transparent electrode layer stacked in the named order on an electrically conductive substrate by immersing said photovoltaic element in the foregoing specific electrolyte solution while supplying an electric field to the photovoltaic element, the reduction of the transparent electrode layer is completed before the backing (that is, the lower electrode layer) starts peeling. By this, side effects such as layer peeling can be desirably prevented from occurring in the electrolytical treatment and the voltage-generating characteristic of the photovoltaic element at a low illumination intensity can be desirably recovered.

As the electric field, when an electric field generated by impressing a bias power to the photovoltaic element is used, there is an advantage in that the conditions relating to the electric field can be optionally selected. When an electric field generated by irradiating light to the photovoltaic element is used, there are advantages in that the electric field is not excessively supplied to the photovoltaic element, and the action of the electric field is surely effected to the defect portion, where the characteristics of the photovoltaic element are effectively recovered.

Further, since the substrate is electrically conductive, the electrode wiring works in the electrolytical treatment can be readily conducted and the electrolytical treatment can be efficiently conducted.

In the present invention, when the bias power is used for generating the electric field, it is desired to be applied in the forward direction to the photovoltaic element. In this case, there is an advantage in that the electrolytical treatment for the defect portion of the photovoltaic element can be efficiently conducted without the normal area of the photovoltaic element being suffered from any negative influence due to the application of the bias power.

In the present invention, when the transparent electrode layer comprises a metal oxide, there is an advantage in that the reduction reaction in the electrolytical treatment preferentially proceeds to the transparent electrode layer rather than to the photoelectric conversion semiconductor layer.

When the photoelectric conversion semiconductor layer in the present invention comprises an amorphous semiconductor material, a large area photovoltaic element of the present invention can be mass-produced by way of a roll-to-roll system.

In the following, the present invention will be detailed while referring to the drawings.

Figure 1A:
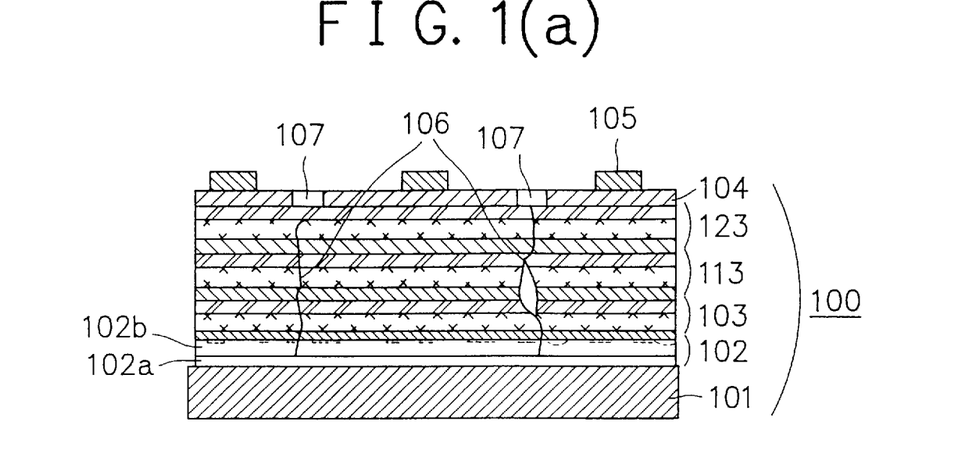
FIG. 1(a) is a schematic cross-sectional view illustrating a photovoltaic element in the present invention.
Figure 1B:
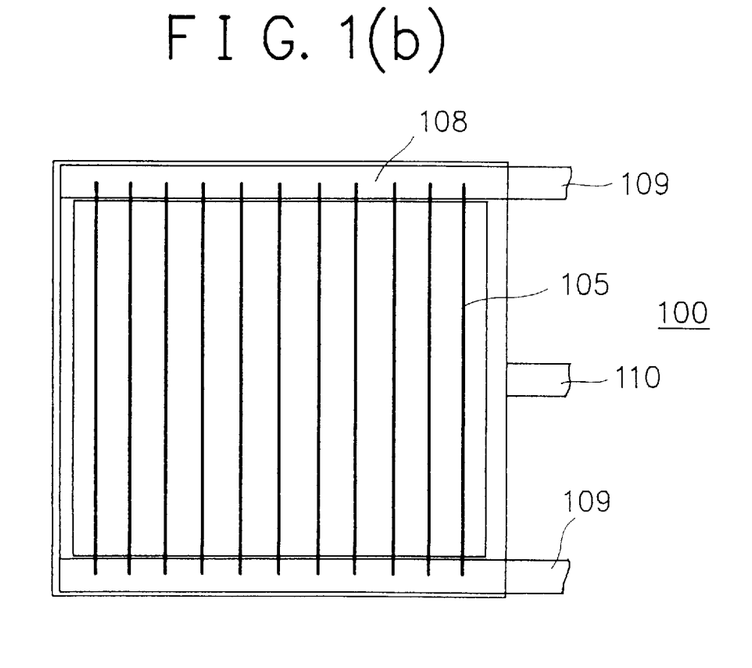
FIG. 1(b) is a schematic plan view illustrating the light incident side of the photovoltaic element shown in FIG. 1(a).

FIG. 1(a) is a schematic cross-sectional view of an example of a photovoltaic device in the present invention. FIG. 1(b) is a schematic plan view, viewed from the light incident side of the photovoltaic element shown in FIG. 1(a).

Particularly, the photovoltaic element shown in FIGS. 1(a) and 1(b) is an amorphous silicon (a-Si) series photovoltaic element (or an a-Si series solar cell) as an example of a photovoltaic element which can be used for the production of a highly reliable photovoltaic element in the present invention. It should be understood that the present invention is not limited to this and the present invention can be applied in the production of any other photovoltaic elements.

In FIGS. 1(a) and 1(b), reference numeral 100 indicates a photovoltaic element having a photoelectric conversion semiconductor layer with a multi-layered structure comprising three photoelectric conversion semiconductor layers (or three cells), namely, a first photoelectric conversion semiconductor layer 103 (hereinafter referred to as bottom cell), a second photoelectric conversion semiconductor layer 113 (hereinafter referred to as middle cell), and a third photoelectric conversion semiconductor layer 123 (hereinafter referred to as top cell), each having a pin junction capable of reacting wit-h the absorption of light impinged to generate an electric current, where the three cells are stacked on a substrate 101.

Each of the three cells 103, 113 and 123 comprises an n-type semiconductor layer, an i-type semiconductor layer and a p-type semiconductor layer being stacked in the named order from the substrate side.

Reference numeral 102 indicates a lower electrode layer (comprising a metal layer 102a and a transparent and electrically conductive layer 102b) disposed between the substrate 101 and the photoelectric conversion semiconductor layer (comprising three cells 103, 113, and 123). Reference numeral 104 indicates a transparent electrode layer comprising a transparent and electrically conductive film which is stacked on the top cell 123. Reference numeral 105 indicates a grid electrode (or a collecting electrode) which is disposed on the transparent electrode layer 104.

Reference numeral 106 indicates defects such as pinhole present in the photovoltaic element. Reference numeral 107 indicates a portion of the transparent electrode 104, which has been made to have an increased electric resistance according to the electrolytical treatment of the present invention.

As above described, FIG. 1(*b*) is a schematic plan view, viewed from the light incident side of the photovoltaic element shown in FIG. 1(*a*). As apparent from FIG. 1(*b*), the grid electrode 105 comprises a plurality of metallic wires which are spacedly arranged at a desired interval on the surface of the transparent electrode layer 104. Reference 108 indicates a bus bar which is disposed on each of the opposite end portions of the photovoltaic element while being electrically connected with end portions of the metallic wires as the grid electrode 105.

Reference numeral 109 indicates a positive side power outputting terminal electrically connected to the bus bar 108, and reference numeral 110 a negative side power outputting terminal electrically connected to the substrate 101. Herein, the grid electrode 105 serves to collect an electric current generated by the photoelectric conversion semiconductor layer. The electric current collected by the grid electrode 105 is further collected by the bus bar 108, followed by being outputted to the outside by the positive side power outputting terminal 109. The lower electrode layer 102 also serves to collect an electric current generated by the photoelectric conversion layer. The electric current collected by the lower electrode layer is outputted to the outside by the negative side power outputting terminal 110.

Description will be made of each constituent of the photovoltaic element 100.

Substrate

In the case of a multi-layered thin film photovoltaic element (or solar cell) having a photoelectric conversion semiconductor layer with a multi-layered structure comprising a plurality of thin semiconductor films being stacked and having a semiconductor junction such as an amorphous silicon series thin film photovoltaic element (or solar cell), said multi-layered structure is formed on an adequate substrate. In this case, the substrate serves to support the multi-layered structure. The substrate in this case may be designed to serves also as an electrode (a lower electrode).

Specifically, the substrate 101 in the photovoltaic element 100 shown in FIGS. 1(*a*) and 1(*b*) serves to support the foregoing photoelectric conversion semiconductor layer comprising the three cells 103, 113 and 123.

The substrate 101 may be an electrically conductive member constituted by an electrically conductive metallic material. Specific example of such electrically conductive member are metal plates such as stainless steel plate, metal foils such as tin foil, and the like. Alternatively, the substrate 101 may be an electrically insulating member constituted by an electrically insulating material and which is applied with an electrically conductive material to at least a part of a surface thereof. Specific example of such electrically insulating material are glass, ceramics, and synthetic resins such as polyimide, and the like.

Lower Electrode

The lower electrode layer 102 (or the lower electrode) is situated between the substrate 101 and the photoelectric conversion semiconductor layer (comprising the three cells 103, 113 and 123). As previously described, the lower electrode layer 102 comprises the metal layer 102*a* and the transparent and electrically conductive layer 102*b*.

The metal layer 102*a* serves as an electrode to output an electric current generated by the photoelectric conversion semiconductor layer and it serves also to reflect incident light into the photoelectric conversion semiconductor layer, the thereby facilitating efficient utilization of the light. The metal layer 102*a* may be designed to have a textured surface capable of making light to be scattered toward the photoelectric conversion semiconductor layer.

The metal layer 102*a* is desired to be constituted by an adequate metallic material capable of effectively reflecting light without causing a loss in the quantity of light to be reflected and without causing migration. Specific example of such metallic material are Al, and aluminum compound such as AlSi and the like.

The metal layer 102*a* may be formed by means of plating, vacuum deposition, sputtering, or the like.

The transparent and electrically conductive layer 102*b* serves to prevent the constituent of the metal layer 102*a* from being diffused into the first photoelectric conversion semiconductor layer 103 (the bottom cell). The transparent and electrically conductive layer 102*b* may be designed to have an uneven surface such that it can refract incident light to prolong the optical path in the photoelectric conversion semiconductor layer.

The transparent and electrically conductive layer 102*b* is desired to be constituted by an adequate transparent and electrically conductive material such as ZnO, $In_2O_3$, ITO, or the like.

The transparent and electrically conductive layer 102*b* may be formed by means of plating, vacuum deposition, sputtering, or the like.

Photoelectric Conversion Semiconductor Layer

As previously described, the photoelectric conversion semiconductor layer in the photovoltaic element 100 has a multi-layered structure comprising three photoelectric conversion semiconductor layers (or three cells), the first photoelectric conversion semiconductor layer 103 (the bottom cell), the second photoelectric conversion semiconductor layer 113 (the middle cell), and the third photoelectric conversion semiconductor layer 123 (the top cell), each having a pin junction capable of reacting with the absorption of light impinged to generate an electric current, where the three cells 103, 113, and 123 are stacked in this order from the side of the substrate 101.

Each of the three cells 103, 113 and 123 comprises an n-type semiconductor layer, an i-type semiconductor layer and a p-type semiconductor layer being stacked in the named order from the substrate side.

Each photoelectric conversion semiconductor layer having a pin junction is constituted by an adequate semiconductor material. As such semiconductor material, there can be illustrated, for example, semiconductor materials comprising an element belonging to group IV of the periodic table such as amorphous silicon (a-Si) semiconductor material, polycrystalline silicon (poly-Si) semiconductor material, and microcrystalline silicon ($\mu$cSi) semiconductor material; semiconductor conductor materials comprising elements belonging to groups II and VI of the periodic table; and semiconductor materials comprising elements belonging to groups III and V of the periodic table.

In the case where the photovoltaic element 100 (the solar cell) is an amorphous silicon series photovoltaic element (or solar cell), the i-type semiconductor layer in each cell may be constituted by, for example, an amorphous semiconductor material comprising one or more elements belonging to group IV of the periodic table. Such amorphous semiconductor material can include, for example, amorphous silicon (a-Si) semiconductor material, amorphous silicon-germanium (a-SiGe) semiconductor material, and amorphous silicon carbide (a-SiC) semiconductor material.

For each of the n-type semiconductor layer and the p-type semiconductor layer in each cell, it may be constituted by, for example, an amorphous semiconductor material comprising one or more elements belonging to group IV of the periodic table which is doped with a valence electron controlling element (a dopant) of n-type or p-type. Such amorphous semiconductor material can include, for example, those amorphous semiconductor materials above mentioned which are doped with a valence electron controlling element (a dopant) of n-type or p-type.

The p-type semiconductor layer may be formed by doping a layer comprising a given amorphous semiconductor material with a p-type dopant using a compound comprising an element belonging to group IIIA of the periodic table such as B, Al, Ga, or In upon the formation of said layer.

The n-type semiconductor layer may be formed by doping a layer comprising a given amorphous semiconductor material with an n-type dopant using a compound comprising an element belonging to group VA of the periodic table such as P, N, As, or Sb upon the formation of said layer.

The semiconductor layer of p- or n-type situated on the light incident side may be constituted by a microcrystalline silicon ($\mu$c-Si) semiconductor material.

The photoelectric conversion semiconductor layer of the photovoltaic element 100 is of the triple cell type as above described. This is not limitative. The photoelectric conversion semiconductor layer may be of a single cell type or tandem type depending upon the situation.

The photoelectric conversion semiconductor layer having such multi-layered structure as above described may be formed by means of a conventional film-forming process such as vacuum evaporation, sputtering, RF plasma CVD, microwave plasma CVD, ECR, thermal-induced CVD, or LP-CVD.

Besides, in order to form a large area photovoltaic element, it is possible to employ a conventional roll-to roll film forming process wherein film formation is conducted while continuously moving a substrate web on which a film is to be formed.

Transparent Electrode

The transparent electrode 104 (or the transparent electrode layer) serves to take up an electromotive force generated by the photoelectric conversion layer (comprising the three cells 103, 113 and 123). The transparent electrode 104 (or the transparent electrode layer) is paired with the lower electrode 102 (or the lower electrode layer).

The transparent electrode 104 is necessary to be used in the case of using a photoelectric conversion semiconductor layer having a high sheet resistance as in the case of an amorphous silicon series photovoltaic element (or solar cell). The transparent electrode 104 is positioned on the light incident side of the photovoltaic element and therefore, it is necessary to be sufficiently light transmissive. The transparent electrode is sometimes identified by the term "upper electrode".

The transparent electrode 104 is desired to have a light transmission factor of 85% or more in order for the transparent electrode to efficiently transmit light into the photoelectric conversion layer. In addition, the transparent electrode 104 is desired to have a sheet resistance of less than 100Ω/□ in order for an electric current generated in the incident light to flow in a crosswise direction to the photoelectric conversion layer.

The transparent electrode 104 may be constituted by an adequate transparent and electrically conductive material which can satisfy the above conditions. Such material can include, for example, metal oxide materials such such $SnO_2$, $In_2O_3$, ZnO, CdO, CdSnO and ITO.

The transparent electrode 104 may be formed by means of plating, vacuum deposition, sputtering, or the like.

Grid Electrode

The grid electrode 105 (the collecting electrode) serves to collect the electric current which is generated by the photoelectric conversion layer (comprising the three cells 103, 113 and 123) and taken up by the transparent electrode.

The grid electrode 105 comprises a plurality of electrically conductive wires spacedly arranged at a desired interval in a comb-like pattern on the surface of the transparent electrode 104. The width and arrangement interval of the grid electrode should be properly determined depending upon the sheet resistance of the transparent electrode 104.

In any case, the grid electrode 105 is required to be designed such that it has a low resistivity and does not provide a series resistance in the photovoltaic element.

The grid electrode 105 may be constituted by an adequate electrically conductive material such as Ag, Ni, Al, Ti, Cr, W, or Cu.

The grid electrode 105 may be formed by means of screen printing, evaporation, soldering, plating, or the like. When it is formed by means of screen printing, there can be employed a manner of providing an electrically conductive paste obtained by mixing a powdery material of any of said metals, a binder resin and a solvent and screen-printing said electrically conductive paste. Alternatively, the grid electrode 105 may be formed by spacedly arranging a plurality of metallic wires constituted by any of the foregoing metals at a desired interval as shown in FIG. 1(b).

In the following, description will be made of the defects 106 (such as pinhole) present in the photovoltaic element.

As previously described, the total thickness of the photoelectric conversion layer (comprising a stacked thin film semiconductor layer) formed in the production of an amorphous silicon series photovoltaic element (the solar cell) is relatively thin. In this respect, in the case where irregularities are present at the surface of a member on which a thin semiconductor film as the photoelectric conversion semiconductor layer is to be formed, it is difficult to form said semiconductor film so as to sufficiently cover such irregularities. For instance, in the case of forming the semiconductor film on a surface of a stainless steel plate as the substrate 101, even when the surface of the stainless steel plate is made to be a polished surface, it is extremely difficult for the polished surface to be absolutely free of surface defects such as protrusion, recess, or distortion. In addition, in the case of continuously forming a semiconductor film as the photoelectric conversion semiconductor layer on a long substrate web as the substrate 101 while moving the substrate web, the substrate web is liable to suffer from mechanical damages such as flaw, recess, or protrusion during the transportation thereof, where such damage sometimes comprises irregularities having a relatively large size. When such damage should be occurred, it results in causing a defect in the semiconductor film formed. For instance, when a protrusion having a relatively large elevation is present on the surface of the substrate on which the semiconductor film to be formed, the semiconductor film is liable to form thereon in a state of not absolutely covering the protrusion. When the transparent electrode is formed on the semiconductor film in such a state, the protrusion of the substrate sometimes results in directly contacting the transparent electrode, where a shunt or short circuit is occurred between the substrate and the transparent electrode through the semiconductor film. Besides, when foreign matter such as dust is deposited during the formation of the semiconductor film as the photoelectric conversion semiconductor layer, the foreign matter contaminated into the semiconductor film provides a film-free region, layer peeled portion, or pinhole in the semiconductor film. In this case, a problem is liable to entail in that the transparent electrode is formed on this semiconductor film in a state of extending to contact with the lower electrode layer or the substrate, where a shunt or short circuit is occurred.

The presence of such defect influences to particularly the voltage-generating characteristic of the photovoltaic element at a low illumination intensity. Specifically, the voltage-generating characteristic of the photovoltaic element will be linearly increased as the illumination intensity is increased, where the voltage component will be exponentially increased. Particularly in this respect, for the voltage component, when the illumination intensity is sufficiently large, for instance, in the extreme case of AM 1.5, there is not occurred a substantial difference depending upon the magnitude of the defect. However, as the illumination intensity is decreased, a distinguishable difference will be increased between the case with no defect and the case with the defect. This tendency becomes significant when the illumination intensity is made to be less than 1000 Lux. In this consequence, it is important for the photovoltaic element to be free of such influence due to the defect for the use in an environment where sunlight is not or insufficiently supplied.

In the following, description will be made of the electrolytical treatment of the present invention.

In the present invention, by making portions 107 of the transparent electrode layer 104, which are situated over the defects 106 present in the photoelectric conversion semiconductor layer (comprising the three cells 103, 113 and 123), to have an increased electric resistance by the electrolytical treatment of the present invention, occurrence of electric current path defects based on the defects 106 can be desirably prevented. The formation of any of the portions 107 having an increased electric resistance (this portion will be hereinafter referred to as high electric resistance-bearing portion) is conducted only in the vicinity of the defect 106. Therefore, the electric resistance of the transparent electrode layer 104 itself is not substantially increased and the series resistance of the entire photovoltaic element is not increased.

The electrolytical treatment of the present invention may be conducted using an adequate electrolytical treatment apparatus.

Figure 2A:
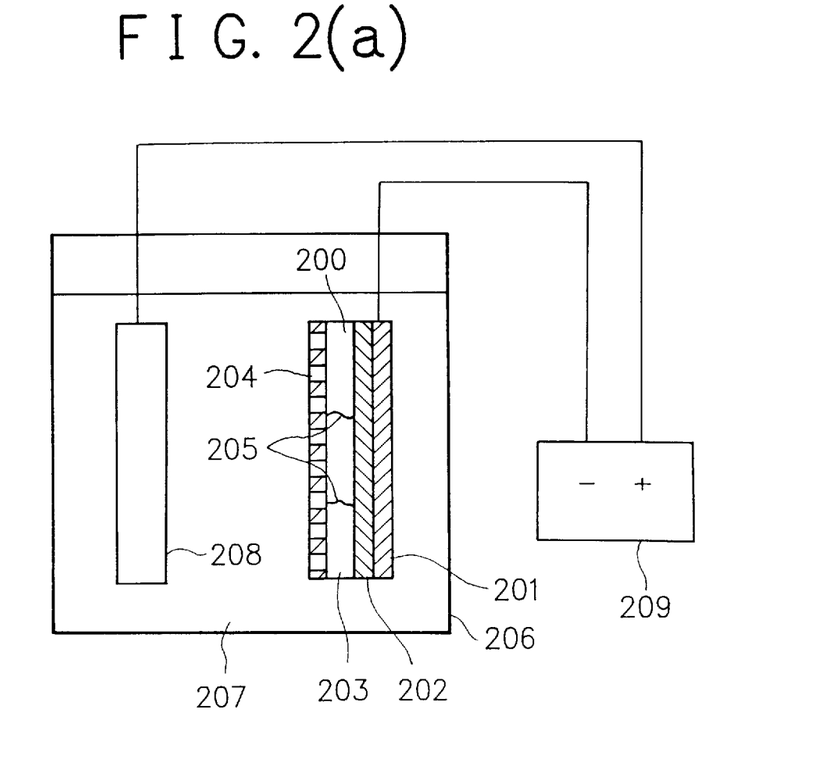
FIG. 2(a) is a schematic diagram illustrating an example of an electrolytical treatment apparatus used in the present invention.
Figure 2B:
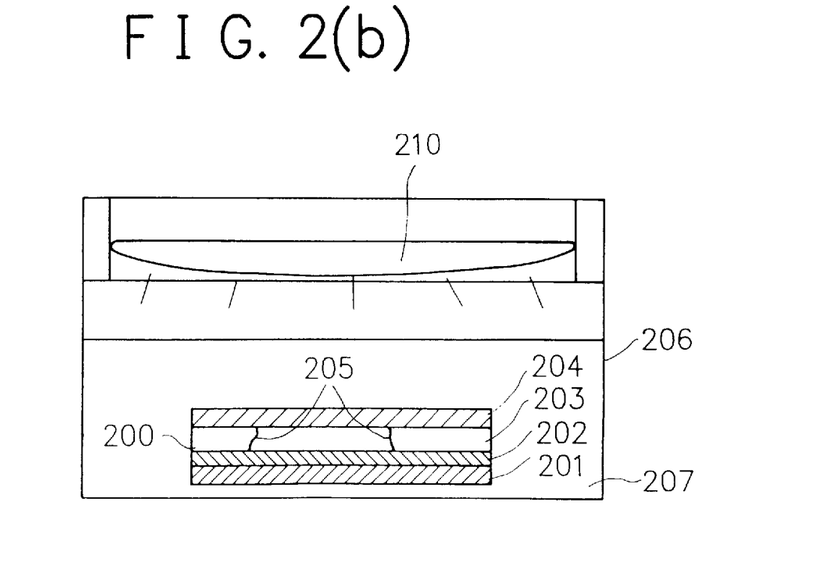
FIG. 2(b) is a schematic diagram illustrating another example of an electrolytical treatment apparatus used in the present invention.

FIG. 2(a) is a schematic diagram illustrating an example of such electrolytical treatment apparatus, in which an external power source is used. FIG. 2(b) is a schematic diagram illustrating another example of such electrolytical treatment apparatus, in which a light irradiation means is used.

FIGS. 2(a) and 2(b), reference numeral 200 indicates a photovoltaic element comprising a lower electrode layer 202, a multi-layered photoelectric conversion semiconductor layer 203 having a p-type semiconductor layer as the outermost constituent layer, and a transparent electrode layer 204 stacked in the named order on an electrically conductive substrate 201, wherein the semiconductor layer 203 has defect portions 205 therein.

Reference numeral 206 indicates an electrolytical treatment vessel containing an electrolyte solution 207 therein.

Reference numeral 208 indicates a counter electrode provided in the electrolytical treatment vessel 206 while immersing in the electrolyte solution 207 (see, FIG. 2(a)). Reference numeral 209 indicates a power source, and reference numeral 210 a light irradiation means.

In the present invention, as previously described, the high electric resistance-bearing portion 107 is formed by reducing the corresponding portion of the transparent electrode layer.

Description will be made of the formation of this portion in the case of using the electrolytical treatment apparatus shown in FIG. 2(a).

The photovoltaic element 200 is immersed in the electrolyte solution 207 contained in the electrolytical treatment vessel 206. The substrate 201 of the photovoltaic element 200, which serves as an electrode in the electrolytical treatment, is electrically connected to the negative terminal of the power source 209, and the counter electrode 208 is electrically connected to the positive terminal of the power source. This system is designed such that a bias voltage is impressed in a forward direction to the photovoltaic element 200. When a bias power is applied between the two electrodes, an electric current flows in the electrolyte solution 207 such that it preferentially passes through the defect portions 205 having a low electric resistance, wherein nascent hydrogen is generated on the negative electrode side, which serves as a photovoltaic voltage-causing side, to engage portions of the transparent electrode layer 204, which are situated over the defect portions 205, in chemical reaction, specifically, in reduction reaction. When the reduction reaction is once occurred, a reaction product provided is successively resolved in the electrolyte solution, where each of the portions of the transparent electrode layer engaged in the reduction reaction is thinned or disappeared, whereby the path for an electric current to be flown into the defect portions in a crosswise direction to the transparent electrode layer is substantially disconnected.

The application of the above electric field to the photovoltaic element in the electrolytical treatment may be also conducted using the electrolytical treatment apparatus shown in FIG. 2(b), where light irradiation is conducted instead of the bias voltage. In this case, the electromotive force generated by the photovoltaic element due to the light irradiation thereto becomes an impressed bias. In this case, the conditions for the bias thus impressed may be properly controlled by adjusting the intensity of the light irradiated.

In the following, description will be made of the prevention of the metal layer 102a from layer peeling in the present invention.

As previously described, the metal layer 102a as a constituent of the lower electrode layer 102 is preferably constituted by Al or AlSi.

For this case, the present inventors obtained a finding that the metal layer (constituted by an aluminum material such as Al or AlSi) is liable to suffer from partial layer peeling due to the presence of halogen ion, particularly $Cl^-$ ion, when treatment using an acidic or alkaline solution is conducted depending upon the film-forming condition for said metal layer.

In order to prevent the occurrence of this problem, it is necessary to have a due care about the film-forming temperature and the film deposition rate. However, it is extremely difficult to effectively form a desirable metal layer (constituted by an aluminum material such as Al or AlSi) capable of efficiently reflecting light at an improved light reflection quantity and which exhibits a sufficient adhesion and is hardly peeled.

The above described layer peeling phenomenon is liable to occur particularly at the interface between the metal layer 102a and the transparent and electrically conductive layer 102b or/and at the interface between the metal layer 102a and the substrate 101.

Through experimental studies, the present inventors obtained a finding that in order to prevent the layer peeling phenomenon of the metal layer 102a due to the $Cl^-$ ion, it is effective that the concentration of the $Cl^-$ ion is controlled to be preferably 0.1 mol/l or less, more preferably 0.03 mol/l or less.

Anyway, in order to prevent the layer peeling phenomenon of the metal layer 102a, it is considered to employ a manner of decreasing the concentration of the halogen ion by decreasing the concentration of the electrolyte solution used in the electrolytical treatment by diluting it with water or the like, or a manner of extremely raising the electrolytical treatment speed in the electrolytical treatment. However, any of these manners is problematic. Particularly, for the former manner, it is difficult to attain a sufficient concentration for the electrolyte solution in order to reduce the corresponding portions of the transparent electrode layer as desired. For the latter manner, it is difficult to complete the electrolytical treatment including after-treatment steps such as the transportation and washing steps within a shortened period of time. In addition, in the case of using an aqueous electrolyte solution, the contamination of $Cl^-$ ion in a small amount is difficult to be avoided.

Under this situation, the present inventors obtained a finding that the use of a protective ion is effective. For instance, in order to prevent the metal layer (composed of an aluminum material such as Al or AlSi) from peeling in an atmosphere containing a chloride, it is effective to add sulfate, nitrite, chromate, acetate, benzoate, or oxalate thereinto. Specifically, it is effective to employ a manner of using an aqueous solution of a given acid or a given salt which contains any of these salts therein as the electrolyte solution in the electrolytical treatment or a manner of using an aqueous solution of one or more of these salts as the electrolyte solution. In the case of the metal later composed of other metal than Al, further addition of $OH^-$ ion, $NO_3^-$ ion, $SO_4^{2-}$ ion, or $ClO_4^-$ ion is effective.

In the following, the present invention will be described in more detail with reference to examples which are only for illustrative purposes and not intended to restrict the scope of the present invention.

Example 1

In this example, there were prepared a plurality of pin junction triple cell type solar cells having the configuration shown in FIGS. 1(a) and 1(b) as will be described below.

On a cleaned substrate web made of SUS430BA (stainless steel) of 125 um in thickness as the substrate 101, there was formed a two-layered lower electrode layer 102 comprising a 1000 Å thick Al layer 102a and a 1 μm thick ZnO layer 102b by means of a conventional sputtering process.

Successively, on the lower electrode layer, there was formed a photoelectric conversion semiconductor layer having a bottom cell 103 comprising a 400 Å thick n-type a-Si layer/a 1000 Å thick i-type a-SiGe layer/a 100 Å thick p-type ic-Si layer, a middle cell 113 comprising a 400 Å thick n-type a-Si layer/a 900 Å thick i-type a-SiGe layer/a 100 Å thick p-type μc-Si layer, and a top cell 123 comprising a 100 Å thick n-type a-Si layer/a 1000 Å thick i-type a-Si layer/a 100 Å thick p-type μc-Si layer being stacked in the named order from the substrate side by means of a conventional plasma CVD process, where the n-type a-Si layer in each of the three cells was formed from a mixture of $SiH_4$ gas, $PH_3$ gas and $H_2$ gas; the p-type μc-Si layer in each of the three cells was formed from a mixture of $SiH_4$ gas, $BF_3$ gas and $H_2$ gas; the i-type a-SiGe layer in each of the bottom and middle cells was formed from a mixture of $SiH_4$ gas, $GeH_4$ gas and $H_2$ gas; and the i-type a-Si layer in the top nip cell was formed from a mixture of $SiH_4$ gas and $H_2$ gas.

Then, on the p-type μc-Si layer of the top cell 123 of the photoelectric conversion semiconductor layer, there was formed a 700 Å thick ITO film as the transparent electrode layer 106 by means of a conventional heat resistance evaporation process.

By this, there was obtained a photovoltaic element formed on the substrate web.

The stainless steel substrate web having the photovoltaic element formed thereon was cut to obtain a plurality of photovoltaic elements of 31 cm×31 cm in size.

The periphery of each photovoltaic element was subjected to chemical etching treatment by a conventional manner to remove the ITO film as the transparent electrode present in the periphery, whereby a photovoltaic element having a square power generation active area of 30 cm×30 cm in size was obtained.

The resultant photovoltaic element (200, see FIGS. 2(a) and 2(b)) was positioned in the electrolytical treatment apparatus shown in FIGS. 2(a) and 2(b) having an electrolyte solution 207 containing 20 wt. % of an octahydrate of aluminum sulfate and having an electric conductivity of 32.0 mS/cm and a chlorine ion content of 0.03 mol/l or less contained therein while maintaining the liquid temperature at 25° C., where the stainless steel substrate side of the photovoltaic element was electrically connected to the negative side of the power source 209, the counter electrode 208 to the stainless steel substrate of the photovoltaic element was electrically connected to the positive side of the power source 209, and the interval between the counter electrode 208 and the stainless steel substrate of the photovoltaic element was made to be 4.0 cm. Then, the photovoltaic element was subjected to electrolytical treatment, where a cycle of impressing a pulse voltage of 5.0 V for 0.3 second at a impression interval of 0.1 second was repeated five times.

The photovoltaic element thus treated was taken out from the electrolytical treatment apparatus, and it was subjected to washing and drying by a conventional manner.

The sum of the period of time spent for the electrolytic treatment and the washing and drying was for 2 minutes.

Thereafter, an electrically insulating adhesive tape (not shown in the figure) was fixed on the peripheral region of the photovoltaic element where no ITO film is present. Then, a copper foil as the bus bar 108 was arranged on the insulating adhesive tape situated on each of the opposite end portions of the photovoltaic element. Successively, a plurality of copper wires coated by a carbon paste as the grid electrode 105 were spacedly arranged on the surface of the photovoltaic element so as to contact with the bus bars 108 as shown in FIG. 1(b), followed by subjecting thermocompression bonding treatment using a conventional thermocompression bonding apparatus, whereby they were bonded on the surface of the photovoltaic element. Then, a copper tab as the positive side power outputting terminal 109 was fixed to the bus bars 108 by means of a solder, and a copper tab as the negative side power outputting terminal 110 was fixed to the stainless steel substrate of the photovoltaic element by means of a solder. By this, there was obtained a solar cell of the configuration shown in FIGS. 1(a) and 1(b).

In this way, there were prepared a plurality of solar cells.

The resultant solar cells were subjected to evaluation as will be later described.

Comparative Example 1

The procedures of Example 1 were repeated, where a plurality of photovoltaic elements were first prepared and then, a plurality of solar cells were prepared using said photovoltaic element, except that the electrolytical treatment for each of the photovoltaic elements prior to preparing a solar cell was conducted under the following conditions.

The electrolyte solution used in Example 1 was replaced by an electrolyte solution containing 10 wt. % of a hexahydrate of aluminum chloride and having an electric conductivity of 64.0 mS/cm and a chlorine ion content of 0.4 mol/l. And while maintaining the electrolyte solution at 25° C. in which the photovoltaic element was immersed in the electrolytic treatment apparatus, the photovoltaic element was subjected to electrolytic treatment, where a cycle of impressing a pulse voltage of 5.0 V for 0.3 second at an impression interval of 0.1 second was repeated five times.

The resultant solar cells were subjected to evaluation as will be described below.

Evaluation

The solar cells obtained in Example 1 and Comparative Example 1 were subjected to evaluation with respect to initial characteristics (exterior appearance, shunt resistance, voltage-generating characteristic, and photoelectric conversion efficiency), and characteristics (exterior appearance, shunt resistance, voltage-generating characteristic, and photoelectric conversion efficiency) after endurance, as will be described below.

1. Evaluation of exterior appearance:

For each of the solar cells obtained in Example 1 and Comparative Example 1, using a microscope, its initial exterior appearance was observed of whether or not layer peeling is present at the interface between the Al layer and ZnO layer as the lower electrode layer and of whether or not swelled or colored layer portion which will be eventually peeled is present even in the case where the backing should be accompanied with neither layer peeling nor exposed portion.

The observed result in each case is described in Table 1.

2. Evaluation of shunt resistance:

For each of the solar cells obtained of Example 1 and those of Comparative Example 1, using a conventional oscilloscope, its initial V-I characteristics (voltage-current characteristics) in dark were measured to obtain a V-I characteristic curve. Based on the gradient near the origin of the V-I characteristic curve, a shunt resistance was obtained. In this way, there were obtained shunt resistances for the solar cells in each case, and an mean value among the shunt resistances was obtained.

The resultant mean shunt resistance obtained in each case is shown in Table 1.

3. Evaluation of voltage-generating characteristic:

In this evaluation, for each of the solar cells of Example 1 and those of Comparative Example 1, its initial voltage generating characteristic with illumination of a low intensity was examined in the following manner. Each solar cell was subjected to irradiation of fluorescence from a fluorescent lamp while varying the illuminance in the range of 0 to 10000 Lux, where the voltage generated with the irradiation of fluorescence with an illuminance of 200 Lux was measured by a conventional manner.

In this way, there were obtained voltages generated for the solar cells in each case, and an mean value among the result ant voltages was obtained.

The resultant mean voltage value obtained in each case is shown in Table 1.

4. Evaluation of initial photoelectric conversion efficiency:

For each of the solar cells of Example 1 and those of Comparative Example 1, its initial photoelectric conversion efficiency was evaluated in the following manner. The solar cell was placed in a solar simulator SPI-SUN SIMULATOR 240A (AM 1.5) (trademark name, produced by SPIRE Company), where a pseudo sunlight spectrum of 100 mW/cm$^2$ was irradiated to the solar cell and its V-I characteristics were measured to obtain a V-I characteristic curve. Based on the V-I characteristic curve, a photoelectric conversion efficiency was obtained. In this way, there were obtained photoelectric conversion efficiencies for the solar cells, and an mean value among the photoelectric conversion efficiencies was obtained in each case.

The mean initial photoelectric conversion efficiency of Example 1 and that of Comparative Example 1 are collectively shown in Table 1. The mean initial photoelectric conversion efficiency of Example 1 shown in Table 1 is a value relative to that of Comparative Example 1, which is set at 1.00.

5. Evaluation of characteristics (exterior appearance, shunt resistance, voltage-generating characteristic and photoelectric conversion efficiency) after endurance:

Each of the solar cells of Example 1 and those of Comparative Example 1, which were used in the above evaluations, was subjected to resin sealing by a conventional lamination manner using sealing resin materials to convert it into a solar cell module. By this, there were obtained a plurality of solar cell modules for each of Example 1 and Comparative Example 1.

For each of the solar cell modules thus obtained, in accordance with the temperature and humidity cycle test A-2 for crystal series solar cell modules prescribed in the JIS Standard C8917, temperature and humidity cycle test was conducted in the following manner. The solar cell module was placed in a thermo-hygrostat capable of controlling the temperature and humidity of a specimen, where the solar cell module was subjected to alternate repetition of a cycle of exposing to an atmosphere of −40° C. for an hour and a cycle of exposing to an atmosphere of 85° C./85% RH for 22 hours, 20 times.

For each of the solar cell modules thus endured through the temperature and humidity cycle test, evaluation was conducted with respect to exterior appearance, shunt resistance, voltage-generating characteristic and photoelectric conversion efficiency in the same manner described in the above evaluations 1 to 4.

The evaluated results with respect to the exterior appearance, shunt resistance and photoelectric conversion efficiency after the endurance are collectively shown in Table 1.

Figure 3:
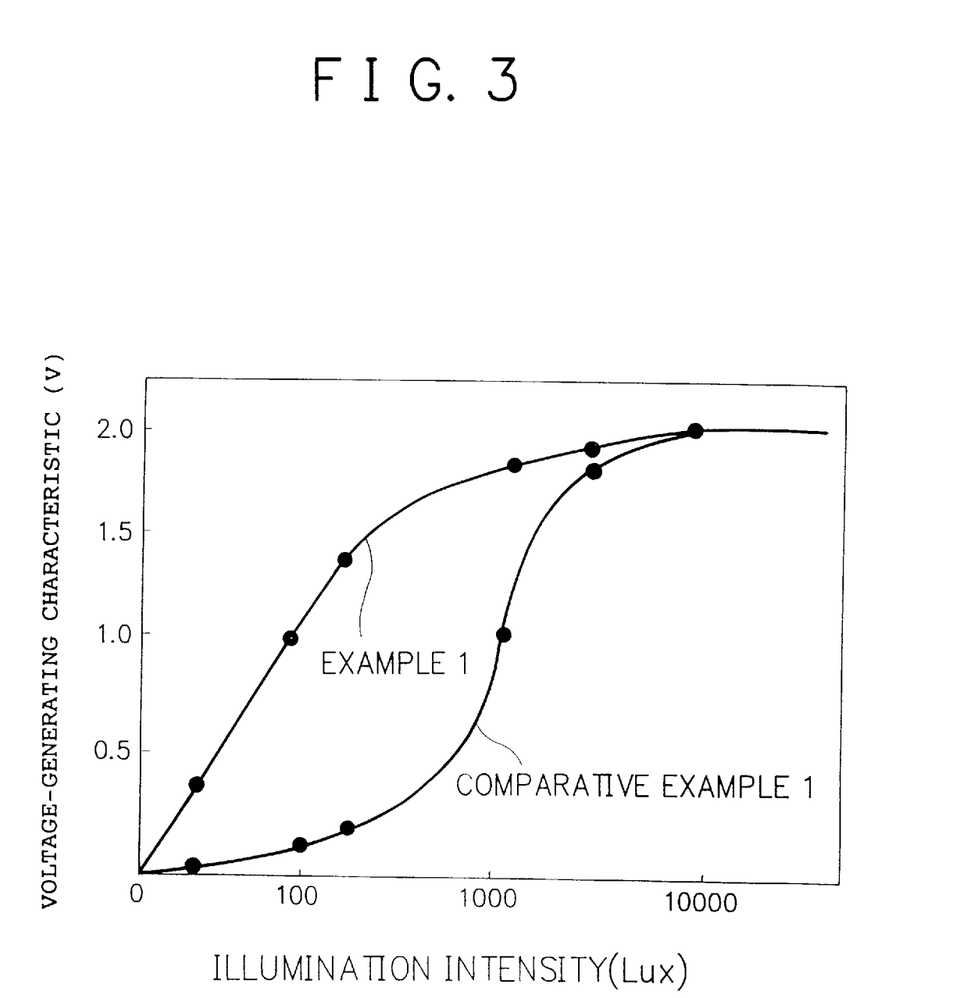
FIG. 3 is a graph showing interrelations between the voltage-generating characteristic and illumination intensity for each photovoltaic element obtained in each of Example 1 and Comparative Example 1 which will be later described.

The evaluated results with respect to the voltage-generating characteristic are graphically shown in FIG. 3.

Each of the values of the shunt resistance after the endurance shown in Table 1 is a value relative to the corresponding mean initial shunt resistance, which is set at 1.0. Similarly, each of the values of the photoelectric conversion efficiency after the endurance shown in Table 1 is a value relative to the corresponding mean initial photoelectric conversion efficiency, which is set at 1.0.

TABLE 1

| | initial characteristics | | | | characteristics after endurance | | |
|---|---|---|---|---|---|---|---|
| | exterior appearance | shunt resistance (kΩ · cm$^2$) | voltage-generating characteristic at 200 Lux (V) | photoelectric conversion efficiency (*1) | exterior appearance | shunt resistance (*2) | photoelectric conversion efficiency (*2) |
| Example 1 | no layer peeling is present | 200 kΩ (little varied) | 1.20 V (little varied) | 1.13 | no layer peeling is present | 0.98 | 0.99 |
| Comparative Example 1 | layer peeling is present | 80 kΩ (greatly varied) | 0.28 V (greatly varied) | 1.00 | increase in the initial layer peeling | 0.85 | 0.90 |

*1: the value of Comparative Example 1 is normalized at 1.0.
*2: a value relative to the initial value which is set at 1.0.

Based on the results shown in Table 1 and also in FIG. 3, the following facts are understood.

Any of the solar cells obtained in Example 1 is apparently superior to those obtained in Comparative Example 1 in terms of the initial characteristics and the characteristics after the endurance through the temperature and humidity cycle test.

Particularly, the solar cells obtained in Comparative Example 1 are low in shunt resistance and they are not satisfactory in photoelectric conversion efficiency. In more detail, for the solar cells obtained in Comparative Example 1, they were found to layer peeling under the metallic wires as the grid electrode, and because of this, in these solar cells, shunt or short-circuit was occurred. In addition, for any of these solar cells, it was found that a swelled layer portion is present even in the area where the backing is not exposed, and because of this, abnormal energization is occurred. Further, their shunt resistance and photoelectric conversion efficiency after the endurance are inferior. For the reasons for this, it is considered such that the swelled layer portion present therein was eventually peeled off due to moisture and thermal shrinkage.

On the other hand, any of the solar cells obtained in Example 1 are free of these problems. Particularly, these solar cells are satisfactory in terms of the exterior appearance, characteristics required for a solar cell, reliability, and yield.

Example 2

The procedures of Example 1 were repeated, where a plurality of photovoltaic elements were first prepared and then, a plurality of solar cells were prepared using said photovoltaic element, except that the electrolytical treatment for each of the photovoltaic elements prior to preparing a solar cell was conducted under the following conditions.

The electrolyte solution used in Example 1 was replaced by an electrolyte solution containing 20 wt. % of a hexahydrate of aluminum acetate and having an electric conductivity of 40.0 mS/cm and a chlorine ion content of 0.03 mol/l or less. And while maintaining the electrolyte solution at 25° C. in which the photovoltaic element was immersed in the electrolytic treatment apparatus, the photovoltaic element was subjected to electrolytic treatment, where a cycle of impressing a pulse voltage of 5.0 V for 0.3 second at an impression interval of 0.1 second was repeated five times.

The resultant solar cells were subjected to evaluation with respect to their initial characteristics in the same manner as in Example 1 and Comparative Example 1.

The evaluated results revealed that the exterior appearance is accompanied by no defect such as layer peeling or the like, the mean initial voltage-generating characteristic with the irradiation of fluorescence with the illuminance of 200 Lux is 1.21 V which is good enough, and the mean initial photoelectric conversion efficiency is 1.13, which is good enough, in terms of a value relative to that of Comparative Example 1, which is set at 1.0.

Example 3

The procedures of Example 1 were repeated, where a plurality of photovoltaic elements were first prepared and then, a plurality of solar cells were prepared using said photovoltaic element, except that the electrolytical treatment for each of the photovoltaic elements prior to preparing a solar cell was conducted under the following conditions.

The electrolyte solution used in Example 1 was replaced by an electrolyte solution containing 20 wt. % of a hexahydrate of manganese sulfate and having an electric conductivity of 40.0 mS/cm and a chlorine ion content of 0.03 mol/l or less. And while maintaining the electrolyte solution at 25° C. in which the photovoltaic element was immersed in the electrolytic treatment apparatus, the photovoltaic element was subjected to electrolytic treatment, where a cycle of impressing a pulse voltage of 5.0 V for 0.3 second at a impression interval of 0.1 second was repeated five times.

The resultant solar cells were subjected to evaluation with respect to their initial characteristics in the same manner as in Example 1 and Comparative Example 1.

The evaluated results revealed that the exterior appearance is accompanied by no defect such as layer peeling or the like, the mean initial voltage-generating characteristic with the irradiation of fluorescence with the illuminance of 200 Lux is 1.21 V which is good enough, and the mean initial photoelectric conversion efficiency is 1.14, which is good enough, in terms of a value relative to that of Comparative Example 1, which is set at 1.0.

Example 4

The procedures of Example 1 were repeated, where a plurality of photovoltaic elements were first prepared and then, a plurality of solar cells were prepared using said photovoltaic element, except that each of the photovoltaic elements prior to subjecting to the electrolytical treatment was irradiated with light of an intensity of 100 mW/cm$^2$ from a metal halide lamp for 60 seconds.

The resultant solar cells were subjected to evaluation with respect to their initial characteristics in the same manner as in Example 1 and Comparative Example 1.

The evaluated results revealed that the exterior appearance is accompanied by no defect such as layer peeling or the like, the mean initial voltage-generating characteristic with the irradiation of fluorescence with the illuminance of 200 Lux is 1.22 V which is good enough, and the mean initial photoelectric conversion efficiency is 1.13, which is good enough, in terms of a value relative to that of Comparative Example, which is set at 1.0.

Example 5

The procedures of Example 1 were repeated, except that as the electrolyte solution used in the electrolytic treatment of the photovoltaic element, there were used a plurality of different electrolyte solutions each comprising the electrolyte solution used in Example 1 which is added with a prescribed amount of potassium chloride to have a different chlorine ion content in the range of 0.007 to 5.000 mol/l, to thereby obtain a plurality of solar cells for each of the electrolyte solutions.

The resultant solar cells were subjected to evaluation with respect to their initial exterior appearance, initial shunt resistance in terms of the mean value, initial photoelectric conversion efficiency in terms of the mean value, and photoelectric conversion efficiency after the endurance through the temperature and humidity cycle test in terms of the mean value, respectively in the same manner as in Example 1 and Comparative Example 1.

The evaluated results are collectively shown in Table 2.

Each of the values of the mean initial photoelectric conversion efficiency shown in Table 2 is a value relative to the mean initial photoelectric conversion efficiency in the case of using the electrolyte solution of 0.050 mol/l in chlorine ion content, which is set at 1.00.

Each of the values of the mean photoelectric conversion efficiency after the endurance shown in Table 2 is a value relative to the corresponding mean initial photoelectric conversion efficiency, which is set at 1.00.

TABLE 2

| Chlorine ion content (mol/l) | exterior appearance | initial shunt resistance ($k\Omega \cdot cm^2$) | initial photoelectric conversion efficiency (relative value) | photoelectric conversion efficiency after endurance (relative value) (*1) |
| --- | --- | --- | --- | --- |
| 0.007 | no layer peeling is present | 230 | 1.06 | 0.99 |
| 0.010 | no layer peeling is present | 219 | 1.06 | 0.99 |
| 0.030 | no layer peeling is present | 212 | 1.05 | 0.99 |
| 0.040 | colored and dotted portions are present | 205 | 1.02 | 0.98 |
| 0.050 | colored and dotted portions are present | 200 | 1.00 | 0.975 |
| 0.070 | colored and dotted portions are present | 195 | 0.96 | 0.97 |
| 0.100 | colored and dotted portions are present | 180 | 0.94 | 0.96 |
| 0.200 | colored and dotted portions are present | 160 | 0.93 | 0.95 |
| 0.500 | layer peeling is present | 70 | 0.89 | 0.90 |
| 1.000 | layer peeling is present | 50 | 0.87 | 0.87 |
| 2.000 | significant layer peeling is present | 45 | 0.83 | 0.83 |
| 5.000 | significant layer peeling is present | 10 | 0.77 | 0.80 |

*1: a value relative to the initial value which is set at 1.0.

Based on the results shown in Table 2, the following facts are understood.

By using a specific electrolyte solution having a chlorine ion content of 0.03 mol/l or less in the electrolytic treatment of a photovoltaic element in the production of a solar cell, there can be efficiently produced a highly reliable solar cell which is free of layer peeling at the interface between the Al layer and ZnO layer as the lower electrode layer and also at the interface between the substrate and the Al layer and which is satisfactory in shunt resistance and photoelectric conversion efficiency, at a high yield. Particularly, any of the solar cells produced using the specific electrolyte solution is free of occurrence of shunt and short-circuit and is also free of abnormal energization which will be occurred due to layer peeling.

What is claimed is:

1. A process for producing a photovoltaic element, said process comprising the steps of:

providing a photovoltaic element comprising (a) a lower electrode layer comprising (a-i) a metallic layer comprising aluminum or an aluminum compound and (a-ii) a transparent and electrically conductive layer, (b) a photoelectric conversion semiconductor layer, and (c) a transparent electrode layer stacked in the named order on a substrate, and, immersing said photovoltaic element in an electrolyte solution to passivate a short-circuited current path defect present in said photovoltaic element by action of an electric field, wherein said electrolyte solution has a chlorine ion content of 0.03 mol/l or less.

2. A process according to claim 1, wherein the electrolyte solution contains a protective ion that prevents occurrence of layer peeling at an interface between the metallic layer (a-i) and the substrate or the transparent and electrically conductive layer (a-ii).

3. A process according to claim 2, wherein the protective ion is an anion selected from the group consisting of sulfate, nitrate, chromate, acetate, benzoate, and oxalate.

4. A process according to claim 1, wherein the electric field is an electric field generated by impressing a bias power to the photovoltaic element.

5. A process according to claim 4, wherein the bias power is impressed in a forward direction to the photovoltaic element.

6. A process according to claim 1, wherein the electric field is an electric field generated by irradiating light to the photovoltaic element.

7. A process according to claim 1, wherein the substrate is constituted by a material selected from the group consisting of metals, glass, ceramics, and resins.

8. A process according to claim 1, wherein the substrate comprises a long substrate, and the long substrate having the photovoltaic element thereon is continuously passed through the electrolyte solution.

9. A process according to claim 1, wherein the aluminum compound contains silicon.

10. A process according to claim 1, wherein at least one of the transparent and electrically conductive layer (a-ii) and the transparent electrode layer (c) comprises a metal oxide.

11. A process according to claim 1, wherein the photoelectric conversion semiconductor layer (b) comprises a non-single crystal semiconductor material.

12. A process according to claim 1, wherein treatment by the electrolyte solution is completed before layer peeling at an interface between the metallic layer (a-i) and the substrate or the transparent and electrically conductive layer (a-ii) is commenced.

* * * * *

UNITED STATES PATENT AND TRADEMARK OFFICE
CERTIFICATE OF CORRECTION

PATENT NO. : 5,859,397
DATED : January 12, 1999
INVENTOR(S) : HIROFUMI ICHINOSE et al.

It is certified that error appears in the above-indentified patent and that said Letters Patent is hereby corrected as shown below:

Title Page, item

[56] REFERENCES CITED

U.S. Patent Documents
"4,729,790 3/1988 Nath et al...437/4" should be deleted.

[57] ABSTRACT

Line 9, "an" (second occurrence) should read --a--.

COLUMN 2

Line 30, "such" should read --much--.
Line 32, "-diminishing" should read --diminishing--.

COLUMN 3

Line 55, "enables" should read --enables one--.
Line 58, "whereby" should read --thereby--.

COLUMN 5

Line 13, "whereby" should read --thereby--.

UNITED STATES PATENT AND TRADEMARK OFFICE
CERTIFICATE OF CORRECTION

PATENT NO. : 5,859,397
DATED : January 12, 1999
INVENTOR(S) : HIROFUMI ICHINOSE et al.

It is certified that error appears in the above-indentified patent and that said Letters Patent is hereby corrected as shown below:

COLUMN 6

Line 51, "wit-h" should read --with--.

COLUMN 7

Line 1, "pinhole" should read --pinholes--.
Line 43, "serves" should read --serve--.
Line 50, "example" should read --examples--.
Line 56, "example" should read --examples--.

COLUMN 8

Line 3, "the" (first occurrence) should be deleted; and "efficient" should read --the efficient--.

COLUMN 9

Line 67, "CdSnO" should read --SdSnO$_4$,--.

UNITED STATES PATENT AND TRADEMARK OFFICE
CERTIFICATE OF CORRECTION

PATENT NO. : 5,859,397
DATED : January 12, 1999
INVENTOR(S) : HIROFUMI ICHINOSE et al.

It is certified that error appears in the above-indentified patent and that said Letters Patent is hereby corrected as shown below:

COLUMN 10

Line 54, "occurred," should read --incurred,--.
Line 63, "occurred," should read --incurred,--.

COLUMN 11

Line 49, "FIGS. should read --In FIGS.--.
Line 61, "(see," should read --(see--.

COLUMN 12

Line 21, "occurred," should read --incurred,--.

COLUMN 13

Line 65, "$_{700}Å$" should read --700Å--.

COLUMN 14

Line 29, "a impression" should read --an impression--.

UNITED STATES PATENT AND TRADEMARK OFFICE
CERTIFICATE OF CORRECTION

PATENT NO. : 5,859,397
DATED : January 12, 1999
INVENTOR(S) : HIROFUMI ICHINOSE et al.

It is certified that error appears in the above-indentified patent and that said Letters Patent is hereby corrected as shown below:

COLUMN 15

Line 41, "an" should read --a--.
Line 56, "an" should read --a--; and
   "result" should read --result- --.
Line 57, "obtained ." should read --obtained.--.

COLUMN 16

Line 12, "an" should read --a--.

COLUMN 17

Line 33, "was occurred" should read --occurred--.

COLUMN 18

Line 45, "at a" should read --at all--.

UNITED STATES PATENT AND TRADEMARK OFFICE
CERTIFICATE OF CORRECTION

PATENT NO. : 5,859,397

DATED : January 12, 1999

INVENTOR(S) : HIROFUMI ICHINOSE et al.

It is certified that error appears in the above-indentified patent and that said Letters Patent is hereby corrected as shown below:

COLUMN 19

Line 40, "Example," should read --Example 1,--.

Signed and Sealed this

Twenty-third Day of November, 1999

Attest:

Attesting Officer

Q. TODD DICKINSON

Acting Commissioner of Patents and Trademarks